US006835997B1

(12) United States Patent
Horch et al.

(10) Patent No.: US 6,835,997 B1
(45) Date of Patent: Dec. 28, 2004

(54) THYRISTOR-BASED DEVICE WITH TRENCH DIELECTRIC MATERIAL

(75) Inventors: Andrew Horch, Sunnyvale, CA (US); Scott Robins, San Jose, CA (US)

(73) Assignee: T-RAM, Inc., San Jose, CA (US)

( * ) Notice: Subject to any disclaimer, the term of this patent is extended or adjusted under 35 U.S.C. 154(b) by 74 days.

(21) Appl. No.: 10/282,294

(22) Filed: Oct. 28, 2002

Related U.S. Application Data

(63) Continuation-in-part of application No. 09/815,213, filed on Mar. 22, 2001.

(51) Int. Cl.[7] .......................... H01L 29/00; H01L 29/74
(52) U.S. Cl. ...................... 257/520; 257/532; 257/119; 257/124; 257/127; 257/163; 257/170
(58) Field of Search ................................ 257/520, 532, 257/119, 124, 127, 163, 170, 296, 298, 300, 301, 305, 516

(56) References Cited

U.S. PATENT DOCUMENTS

| 4,797,373 A | | 1/1989 | Malhi et al. | |
|---|---|---|---|---|
| 5,528,062 A | | 6/1996 | Hsieh et al. | |
| 5,838,026 A | * | 11/1998 | Kitagawa et al. | ........... 257/139 |
| 6,104,045 A | | 8/2000 | Forbes et al. | |
| 6,225,165 B1 | | 5/2001 | Noble, Jr. et al. | |
| 6,229,161 B1 | | 5/2001 | Nemati et al. | |

OTHER PUBLICATIONS

Jun. 1998, Nemati, Farid, and Plummer, James D., "A Novel High Density, Low Voltage SRAM Cell with a Vertical NDR Devide",VLSI Technology Technical Digest.
1999, Nemati, Farid, and Plummer James, D., "A Novel Thyristor–based SRAM Cell (T–RAM) for High–Speed, Low–Voltage, Giga–scale Memories", International Electron Device Meeting Technical Digest.
K. De Meyer, S. Kubicek and H. van Meer, *Raised Source/Drains with Disposable Spacers for sub 100 nm CMOS technologies*, Extended Abstracts of International Workshop on Junction Technology 2001.
Mark Rodder and D. Yeakley, *Raised Source/Drain MOSFET with Dual Sidewall Spacers*, IEEE Electron Device Letters, vol. 12, No. 3, Mar. 1991.
Yang–Kyu Choi, Daewon Ha, Tsu–Jae King and Chenming Hu, *Nanoscale Ultrathin Body PMOSFETs With Raised Selective Germanium Source/Drain*, IEEE Electron Device Letters, vol. 22, No. 9, Sep. 2001.

Oct. 10, 2001, N. Lindert, Y.–K. Choi, L. Chang, E. Anderson, W.–C. Lee, T.–J. King, J. Bokor, and C. Hu. *Quasi–Planar FinFETs with Selectivley Grown Germanium Raidse Source./Drain*, 2001 IEEE International SOI Conference, 10/01.
1998, T. Ohguro, H. Naruse, H. Sugaya, S. Nakamura, E. Morifuji, H. Kimijima, T. Yoshitomi, T. Morimoto, H.S. Momose, Y. Kastumata, and H. Iwai, *High Performance RF Characteristics of Raised Gate/Source/Drain CMOS with Co Salicide*, 1998 Symposium on VLSI Technology Digest of Technical Papers.
Hsiang–Jen Huang, Kun–Ming Chen, Tiao–Yuan Huang, Tien–Sheng Chao, Guo–Wei Huang, Chao–Hsin Chien, and Chun–Yen Chang, *Improved Low Temperature Characheristics of P–Channel MOSFETs with $Si_{1-x}$ Gex Raised Source and Drain*, IEEE Transactions on Electron Devices, vol. 48, No. 8, Aug. 2001.
Stanley Wolf Ph.D. and Richard N. Tauber Ph.D., *Silicon Processing for The VLSI Era*, vol. 1, 1986, pp. 285–286.
Ponomarev et al., *High–Performance Deep SiubMicron CMOS Technologies with Polycrystalline–SeGe Gates*, IEEE Transactions on Electron Devies, vol. 47, No. 4, pp. 848–855, Apr. 2000.

* cited by examiner

*Primary Examiner*—Minohlan Tran
*Assistant Examiner*—Tan Tran

(57) ABSTRACT

A thyristor-based semiconductor device includes a thyristor body that has at least one region in the substrate and a thyristor control port in a trenched region of the device substrate. According to an example embodiment of the present invention, the trench is at least partially filled with a dielectric material and a control port adapted to capacitively couple to the at least one thyristor body region in the substrate. In a more specific implementation, the dielectric material includes deposited dielectric material that is adapted to exhibit resistance to voltage-induced stress that thermally-grown dielectric materials generally exhibit. In another implementation, the dielectric material includes thermally-grown dielectric material, and when used in connection with highly-doped material in the trench, grows faster on the highly-doped material than on a sidewall of the trench that faces the at least on thyristor body region in the substrate. In still another implementation, the dielectric material includes both a thermally-grown dielectric material and a deposited dielectric material. These approaches are particularly useful, for example, in high-density and other applications where thermally-stable dielectric materials are desirable and/or where dielectric material growth at different rates is desirable.

8 Claims, No Drawings

THYRISTOR-BASED DEVICE WITH TRENCH DIELECTRIC MATERIAL

RELATED PATENT DOCUMENTS

This patent document is related to U.S. patent application Ser. No. 10/262,729 (TRAM.014PA), filed on Oct. 1, 2002 and entitled "Trench Isolation for Thyristor Based Device," and is a Continuation-in-part of U.S. patent application Ser. No. 09/815,213 (TRAM.005PA), filed on Mar. 22, 2001 and entitled "Thyristor-based Device Including Trench Isolation," both of which are fully incorporated herein by reference.

FIELD OF THE INVENTION

The present invention is directed to semiconductor devices and, more specifically, to thyristor-based devices such as thyristor-based memory devices and switching circuits.

BACKGROUND

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has become increasingly important.

An important part in the circuit design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price). DRAM cell size is typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order or magnitude faster than DRAM. Also, unlike DRAM, SRAM does not require refresh. SRAM cells are typically constructed using 4 transistors and 2 resistors or 6 transistors, which result in much lower density and exhibits a feature size that is typically between about 60 $F^2$ and 100 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

Thin capacitively-coupled thyristor-type NDR device can be used to overcome a variety of limitations, including those discussed above, in memory cells and other devices. However, an important consideration in semiconductor device design, including the design of memory cells employing thin capacitively-coupled thyristors, is forming the device in a highly dense array. In order to achieve a dense array, dielectric and/or insulative material is often located near to conductors carrying a voltage that can induce stress on thermally-grown oxide and other similar materials. In addition, it is sometimes difficult to thermally grow a high quality oxide dielectric on a silicon substrate having a high concentration of defects therein.

These and other design considerations have presented challenges to the implementation of such a thin capacitively-coupled thyristor to bulk substrate applications, and in particular to applications where highly-dense arrays of thyristors are desirable.

SUMMARY

The present invention is directed to overcoming the above-mentioned challenges and others related to the types of devices and applications discussed above and in others, such as memory cells and switching circuits. The present invention is exemplified in a number of implementations and applications, some of which are summarized below.

According to an example embodiment of the present invention, a semiconductor device is manufactured with trench in a substrate, the trench being at least partially filled with both a dielectric material and a capacitively-coupled control port. The trench is formed adjacent to a thyristor body region, and control port is adapted for capacitively coupling to the thyristor body for controlling current flow therein. The dielectric material is deposited and/or thermally grown, with deposited or partially deposited dielectric material being able to withstand a higher voltage stress, for example, relative to similar thermally-grown dielectric. In one particular implementation, deposited or partially deposited dielectric material has a higher capacitive coupling ratio (e.g., between the control port and the thyristor body) than a thermally grown dielectric, under certain conditions. These approaches are particularly useful, for example, when trying to form a dielectric on silicon, such as polycrystalline silicon typically used in semiconductor substrates.

In connection with one implementation, deposited dielectric material is used in the trench, either alone or in combination with thermally-grown dielectric material. It has been discovered that the defect density of such a deposited dielectric material is relatively independent of the crystalline structure and/or defects present in silicon on which the dielectric is deposited, such as silicon on sidewalls of the trench, and/or doped silicon filler material in the trench. With this approach, it is possible to form a much higher quality dielectric (e.g., fewer defects, less susceptible to breakdown and thus more reliable) relative to, for example, dielectric formed using thermal oxidation alone.

In another implementation, highly-doped silicon (e.g., crystalline and/or polycrystalline silicon) is used in selected portions of the semiconductor device where oxide material is to be thermally grown. In one instance, doped polysilicon filler material is formed in the trench, and in another instance, silicon sidewalls of the trench are doped. Oxide material is then thermally grown with conditions that result in a much thicker oxide layer being formed on highly-doped portions of the silicon, relative to an oxide layer thermally-grown on lower-doped portions of the silicon. With this approach, relatively different oxide thicknesses in the trench can be achieved using a single thermal growth process. This approach is particularly useful, for example, when the thermally-grown oxide is to be used for different purposes in different portions of the trench, such as for electrically isolating the control port and for separating the control port from conductive material in the trench.

In another example embodiment of the present invention, a memory array includes a plurality of memory cells, each memory cell having a capacitively-coupled thyristor and one or more deposited and/or thermally-grown dielectric materials in a trench, as discussed above. Each thyristor includes anode and cathode end portions, each end portion having a base region electrically coupled to an emitter region, and each base region being electrically coupled to one another. Each memory cell also includes a pass device having source/drain regions separated by a channel region and a gate capacitively coupled to the channel region. One of the source/drain regions is coupled in series with the thyristor at a first one of the emitter regions, and another one of the source/drain regions is coupled to a bit line. A first word line is adapted to apply a voltage to the gate of the pass device for controlling the current flow therein, where the pass device forms a conductive link between the bit line and the thyristor when the pass device is in a conducting state. A second word line is adapted to apply a voltage to the control port of the thyristor for controlling current flow therein, and a second one of the emitter regions is coupled to a conductor at a reference voltage.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which:

FIG. 1A is a thyristor-based semiconductor device at an early stage of manufacture and having a trench with a dielectric material deposited in the trench, according to an example embodiment of the present invention;

FIG. 1B is the semiconductor device of FIG. 1A having a control port formed in the trench, according to another example embodiment of the present invention;

FIG. 1C is the semiconductor device, similar to that shown in FIG. 1A at a later stage of manufacture and having conductive filler material formed in the trench as a spacer, with a control port over the conductive material, according to another example embodiment of the present invention;

FIG. 2 is a thyristor-based memory cell having a dielectric material formed in a trench, according to another example embodiment of the present invention; and FIG. 3 is a memory array having a plurality of thyristor-based memory cells, at least one of the memory cells including a dielectric material formed in a trench, according to another example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor applications, and has been found to be particularly useful for thyristor-based applications employing dielectric material for insulative, capacitive coupling and other purposes. While the present invention is not necessarily limited to such applications, various aspects of the invention may be appreciated through a discussion of various examples using this context.

According to an example embodiment of the present invention, a thyristor-based semiconductor device is formed having deposited and/or thermally-grown dielectric material in a trench adjacent to a thyristor body region in a substrate. When deposited, the dielectric material exhibits certain beneficial characteristics, such as those discussed above, including reduced sensitivity to defects on or in a substrate material in the trench where the dielectric material is deposited, relative to the sensitivity to defects of a similar thermally-grown dielectric material. Such a deposited dielectric material may also exhibit a higher dielectric value than a comparable thermally-grown dielectric, which has been discovered to be particularly useful in thin capacitively-coupled thyristor applications. In certain applications and implementations, when disposed between a control port and a base region of the thin capacitively-coupled thyristor, the deposited dielectric material facilitates stronger capacitive coupling between the control port and the base region. Stronger capacitive coupling typically improves performance of such a thin capacitively-coupled thyristor, for example, by improving the thyristor's ability to switch between and/or maintain conductance states.

When thermally grown, the dielectric material also exhibits certain beneficial characteristics, including the ability to be implemented with a differential growth approach that forms a thicker dielectric material on heavily-doped substrates (e.g., a polysilicon gate), relative to lightly-doped or undoped substrates (e.g., bulk silicon). The use of such a thermally-grown dielectric material has been found to be particularly useful in implementations benefiting from different types of insulative characteristics at different portions of a device. By using deposited dielectric material, thermally-grown dielectric material or a combination thereof, the trench dielectric material is tailored to one or more specific implementations.

In one example implementation, deposited dielectric material is formed on a sidewall of a trench and facing the thyristor body region. A control port is formed in the trench and separated from the thyristor body region by the deposited dielectric material. In response to a signal applied thereto, the control port capacitively couples a signal to the thyristor body region via the deposited dielectric material. With this approach, the capacitively coupled signal can be used to control current flow in the thyristor body, for example, by passing and blocking current therein. In this implementation, the deposited dielectric material exhibits resistance to breakdown under voltage stress that exists when the signal from the control port is being capacitively coupled to the thyristor body region.

In another implementation, a conductive filler material (e.g., heavily-doped polysilicon) is formed in the trench, followed by differential thermal growth of dielectric material on the conductive filler material and on a sidewall of the trench. The thermal growth on the conductive filler material occurs at a rate higher than the rate of thermal growth on the sidewall. In one instance, this growth is enhanced using relatively low-temperature and high humidity growth conditions. In another particular instance, the thermal growth rate on the conductive filler material is about five times higher than the thermal growth rate on the sidewall, resulting in a dielectric thickness on the conductive filler material that is about five times greater than the dielectric thickness on the sidewall.

After the thermal growth of dielectric material, a control port is formed in the trench and over the dielectric material thermally grown on the conductive material. With this approach, the control port is electrically insulated from the conductive filler material by the thicker dielectric material, which exhibits a relatively low capacitance, and can capacitively couple to the thyristor body region via the thinner dielectric material on the sidewall, which exhibits a relatively higher capacitance. This differential growth approach is particularly useful for growing dielectric material using a reduced number of steps, or even a single growth step, while realizing different dielectric thicknesses for both insulative and capacitive coupling purposes.

In another implementation, conductive filler material is formed near a bottom portion of the trench and dielectric material is deposited over the conductive filler material. A control port is then formed in the trench and separated from the conductive material by the deposited dielectric material, which also electrically insulates the control port from the conductive filler material. As discussed in the example embodiments and implementations above, the control port is adapted to capacitively couple to the thyristor body for controlling current therein. In on particular instance, dielectric material is also deposited on one or more sidewalls and/or a bottom of the trench, prior to forming the conductive material in the trench. The deposited dielectric material electrically insulates the conductive material from the thyristor body region and/or from other circuitry in the device. In another instance, the deposited dielectric material is formed laterally adjacent to the conductive material and on a sidewall of the trench between the conductive material and the thyristor body, and electrically insulates them from one another. In still another instance, the dielectric material is formed on a sidewall of the trench and control port is arranged to capacitively couple a signal to the thyristor body region via the dielectric material on the sidewall of the trench.

The deposited dielectric material maintains insulative characteristics while enduring voltage-induced stress from one or both of the conductive material and control port, as discussed above. As such, the example embodiments described herein are particularly useful in applications employing high-density circuits and/or trenches with high aspect ratios (e.g., greater than 2:1), which makes forming insulative material near a bottom portion of the trench difficult. Using conductive material near the bottom of the trench with a deposited dielectric material to insulate the conductive material from adjacent circuitry, high aspect ratio trenches are readily implemented to form high-density circuits. For general information regarding thyristor-based semiconductor devices, and for specific information regarding the use of conductive material to fill a trench having a high aspect ratio and other trench-related aspects, reference may be made to the above-referenced patent document entitled "Trench Isolation for Thyristor Based Device" (Horch et al.).

FIG. 1A shows a thyristor based semiconductor device 100 being manufactured, according to a more specific example embodiment of the present invention. A trench 105 is etched around a thyristor body region 110 in a substrate 102. The thyristor body region 110 may, for example, include one or more portions of a thyristor, such as a base region, which is coupled to other thyristor regions. An emitter region 116 of the thyristor-body region 110 is implanted via a bottom portion of the trench 105, and a dielectric material 120 is deposited on sidewalls of the trench 105 using a typical deposition process, such as chemical vapor deposition (CVD). The deposited dielectric material 120 is adapted to exhibit lower stress in response to voltage, relative to the stress exhibited by a thermally-grown dielectric. Additional circuitry can then be implemented in the trench 105 while maintaining characteristics of the dielectric (e.g., insulative and capacitive properties) independently from a voltage at which the circuitry operates.

Various ones of the example embodiments described below in connection with the figures share similar features with each other and with FIG. 1A. In each of these Figures, certain discussion of similarly numbered features is omitted for brevity.

FIG. 1B shows the semiconductor device of FIG. 1A undergoing further processing, according to another example embodiment of the present invention. Insulative material 122 is formed in the trench 105 and between the dielectric material 120 on opposite sides of the trench 105. A conductive control port 150 is then formed over the insulative material 122, and additional insulative material 124 is formed over the control port 150. The control port 150 and the dielectric material 120 between the control port and the thyristor body region 110 are configured and arranged such that the control port is adapted to capacitively couple to the thyristor body region 110 for controlling current flow therein. For general information regarding thyristor-based semiconductor devices to which various example embodiments of the present invention are applicable, and for specific information regarding using control port 150 to capacitively couple to the thyristor body region and example dimensions thereof, reference may be made to U.S. Pat. No. 6,229,161 (Nemati et al.), which is fully incorporated herein by reference.

The trench 105 extends at least partially around the thyristor body region 110 and is arranged such that capacitive coupling between the control port 150, formed in the trench, and the thyristor body region is sufficient for controlling current flow in the thyristor body region. In one implementation, the control port 150, trench 105 and body region 110 are arranged such that there is an outflow of minority carriers in the thyristor body region in response to the capacitive coupling. Specifically, the thyristor body region is sufficiently thin such that the coupling of one or more voltage transitions thereto via the control port causes the outflow and switches the thyristor between a current-passing mode and a current-blocking mode.

In other implementations, the dielectric material 120 is further adapted to electrically insulate the control port 150 from other adjacent circuitry (not shown) in the device. The deposited dielectric material 120 between the control port 150 and the thyristor body region 110 is adapted to exhibit reduces stress, relative to the stress that would be exhibited were the dielectric material thermally grown. This reduced stress is exhibited at an operating voltage at which the control port 150 is adapted to be operated for controlling current in the thyristor body 110 (e.g., between −2.0 volts and 2.0 volts).

FIG. 1C shows a semiconductor device, similar to that shown in FIG. 1A, being formed according to another example embodiment of the present invention. FIG. 1C has its articles labeled similarly to articles in FIGS. 1A and 1B, with certain discussion of similar articles omitted for brevity. An insulative material liner 121 is formed near a bottom portion of a trench 105, and a conductive material 130 is formed in the lined bottom portion of the trench 105. The insulative material liner 121 may, for example, include and oxide and/or other dielectric material, and may be thermally grown and/or deposited. The conductive material 130 may, for example, include polysilicon, doped polysilicon or other similar material. The combination of the insulative liner 121 and the conductive material 130 fills a bottom portion of the trench 105 and electrically isolate a portion of the thyristor region 110 from other circuitry in the substrate 102. For example, another thyristor body region with a surrounding trench having a control port may be formed on an opposite side of the trench from the thyristor region 110 to form a high-density circuit, such as the memory array discussed below in connection with FIG. 3.

After the conductive material 130 is formed in the trench 105, dielectric material 123 and 125 are formed in one of a variety of manners. In one instance, the dielectric material 123 is deposited on the conductive material 130 and dielectric material 125 is deposited on sidewalls of the trench 105 and over the dielectric material 123. In another instance, the dielectric materials 123 and 124 are simultaneously thermally grown, with the conductive material 130 being used to form the dielectric material 123 relatively thicker than the dielectric material 125. In still another instance, a combination of thermal growth and deposition is used to form the dielectric materials 123 and 125. In each of these instances, a control port 150 is formed over the dielectric material 123. Insulator material 124 is then formed over the control port 150 and filling the upper portion of the trench 105. The dielectric material 123 is adapted to electrically insulate the conductive material 130 from the control port 150. The control port 150 is adapted to be capacitively coupled to the thyristor body region 110 via the dielectric material 125. In addition, one or more of the insulative/dielectric materials 124 and 121 may also include a deposited and/or thermally-grown dielectric material.

FIG. 2 is a thyristor-based memory cell 200 formed having a dielectric material and a control port in a trench, according to another example embodiment of the present invention. The thyristor-based memory cell 200 may, for example, be formed using one or more of the methods described in connection with FIGS. 1A–1C. A P+ anode sinker 270 is implanted in a portion of a substrate 201 and used for contacting a lower emitter region 216 of a thyristor, and is optionally annealed to drive a portion of the doping further into the substrate. The anode sinker 270 is useful for bringing a contact, such as a reference voltage, to the thyristor.

A trench 205 is etched around a thyristor region 210 and into the substrate 201, and a P+ implant is effected via a bottom portion of the trench 205 to form the emitter region 216. An insulative liner material 221 is formed in the trench 205, and a first conductive material 230 (e.g., polysilicon and/or metal) is formed in the lined trench. The conductive material 230 is etched back (e.g., down) to a desired height in the trench with the etch back result shown. Any of the liner material 221 that had had been formed over the first conductive material 230 is etched using the first conductive material 230 as an etch stop and a dielectric material 220 is formed in the trench 205 (e.g., using a deposition and/or thermal growth). A second conductive material is then deposited and etched to form control port 250 in the trench 205 adjacent to a portion of the dielectric material 220 on a sidewall 223 of the trench. Oxide and/or another insulative material 291 is formed over the control port and subsequently polished.

Thyristor body portions including N-base region 212, P-base region 214 and N+ emitter region 218 are implanted in the thyristor body region 210. The control port 250 is adapted to capacitively couple a signal to the P base region 214 via the dielectric material 220 on the sidewall for controlling current flow in the thyristor (e.g., for switching the thyristor between a blocking state and a conducting state). Portions of the thyristor are electrically insulated from other circuitry in the device via the portion of the trench 205 including the first conductive material 230 and the insulative liner 221.

A logic device 260 includes N+ source/drain regions 262 and 264 formed in the substrate 201 and separated by a channel 266. A gate dielectric material 269 is formed over the channel, and a gate electrode 268 is formed adapted to be capacitively coupled to the channel 266 via the gate dielectric material 269 for controlling current flow between the source/drain regions 262 and 264. An interconnect 272 is formed between the source/drain region 262 and the emitter region 218 of the thyristor, electrically coupling the logic device 260 in series with the thyristor body region 210. A bit line interconnect 274 electrically couples the source/drain region to a bit line. The gate 268 is adapted to switch the channel 266 between a blocking state and a conductive state in response to a voltage being applied thereto, and thus forms a conductive channel between the bit line interconnect 274 and the emitter region 214.

The N+ emitter region 214 is adapted to store data for read and write access (e.g., for storing voltage corresponding to a "one" or a "zero" value as a function of the conductance state of the thyristor). The gate 268 is part of a first word line, the control port 250 is part of a second word line, and the P+ anode sinker 270 is coupled to a reference voltage line (Vref). By controlling the first and second word lines and the bit line (e.g., as described in U.S. Pat. No. 6,229, 161), read and/or write access to the N+ emitter region is effected.

FIG. 3 is a memory array 300 including at least one thyristor-based memory cell 320 having a dielectric material in a trench around a thyristor body region 310, according to another example embodiment of the present invention. The thyristor-based memory array 300 may, for example, include one or more of the devices shown in FIGS. 1A–2. Each memory cell includes a pass device coupled in series with a thyristor having a buried emitter region (e.g., as shown in FIG. 2). A variety of memory cells share word lines, bit lines and conductive pillar contacts.

Referring to memory cell 302 as an example, shallow trench isolation (STI) regions 370 and 372 are formed in a substrate and on opposite sides of the memory cell 302, thereby electrically isolating adjacent memory cells. The memory cell 302 includes a thyristor having a control port (WL2) 320 surrounding a portion of a thyristor body region 310 and formed in a trench region 305, with the control port being used by adjacent memory cells. The trench region 305 includes a dielectric material between the control port 320 and the thyristor body region 310, with the control port 320 being adapted to capacitively couple a signal to the thyristor body region 310 via the dielectric materials (e.g., similar to the dielectric material 220 shown in FIG. 2). A thyristor emitter region (e.g., such as region 216 in FIG. 2) is disposed below other portions of the thyristor body 310, and a P+ anode contact 355 makes electrical connection to buried thyristor emitter regions of adjacent memory cells. A pass device (e.g., similar to device 260 in FIG. 2) includes source/drain regions 332 and 334 separated by a channel region below a first word line (WL1) 338, with the source/drain region 332 being coupled in series to the thyristor body 310 via a conductive interconnect 340. A bit line contact 360 electrically couples the source/drain region 334 to a metal1 (M1) bit line.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors, dielectric materials, and shunts; adding structures to the integrated circuit device; increasing the number of PN sections in the thyristor; and interchanging P and N regions and/or interchanging PMOSFETS with NMOSFETS. In addition, for general information regarding thyristors including thin capacitively-coupled thyristors, and for particular information regarding implementations to which the present invention is applicable and their respective operations, reference may be made to U.S. Pat. No. 6,229,161, referenced above. Such modifications and changes do not depart from the true spirit and scope of the present invention that is set forth in the following claims.

What is claimed is:

1. A thyristor-based semiconductor device comprising:
a thyristor having a capacitively-coupled control port and a body region, at least one portion of the body region being in and defined by a substrate;
a trench in and defined by the substrate and adjacent to the at least one thyristor body portion in the substrate, the trench being at least partially filled and including a dielectric material wherein the dielectric material includes a deposited dielectric material that exhibits higher resistance to voltage-induced stress, relative to thermally-grown dielectric material, and the control port, the control port being configured and arranged to capacitively couple to the thyristor body region via a sidewall of the trench for controlling current flow in the thyristor body region; and
conductive filler material in the trench, wherein the deposited dielectric material electrically insulates the conductive filler material from the control port.

2. The thyristor-based semiconductor device of claim 1, wherein the deposited dielectric material is contiguously adjacent to both the conductive filler material and the control port.

3. A thyristor-based semiconductor device comprising:
a thyristor having a capacitively-coupled control port and a body region, at least one portion of the body region being in and defined by a substrate;
a trench in and defined by the substrate and adjacent to the at least one thyristor body portion in the substrate, the trench being at least partially filled and including a dielectric material wherein the dielectric material includes a deposited dielectric material that exhibits higher resistance to voltage-induced stress, relative to thermally-grown dielectric material, a thermally-grown dielectric material, and the control port, the control port being configured and arranged to capacitively couple to the thyristor body region via a sidewall of the trench for controlling current flow in the thyristor body region; and
conductive filler material in the trench, wherein the thermally-grown dielectric material is disposed between the conductive filler material and the control port and wherein the deposited dielectric material is disposed between the control port and the thyristor body portion in the substrate.

4. A thyristor-based semiconductor device comprising: a thyristor having a capacitively-coupled control port and a body region, at least one portion of the body region being in and defined by a substrate;
a trench in and defined by the substrate and adjacent to the at least one thyristor body portion in the substrate, the trench being at least partially filled and including a dielectric material wherein the dielectric material includes a thermally-grown dielectric material that exhibits a faster growth rate on higher-doped substrates, relative to a growth rate on lesser doped substrates, and the control port, the control port being configured and arranged to capacitively couple to the thyristor body region via a sidewall of the trench for controlling current flow in the thyristor body region; and
a conductive filler material in the trench, wherein the thermally-grown dielectric material is contiguously adjacent to both the sidewall of the trench and the conductive filler material, the thermally-grown dielectric material contiguously adjacent to the conductive filler material being thicker than the thermally-grown dielectric material contiguously adjacent to the sidewall of the trench.

5. A thyristor-based memory cell comprising:
a thyristor having a capacitively-coupled control port and a body with first and second contiguously adjacent bass regions disposed between first and second emitter regions, the first base region being contiguously adjacent to the first emitter region and the second base region being contiguously adjacent to the second emitter region, the first base region being disposed in and defined by a substrate, the first emitter region being configured and arranged to store data therein and the second emitter region being electrically coupled to a reference voltage line;
a trench in and defined by the substrate and adjacent to the first base region, the trench being at least partially filled and including a dielectric material and the control port, the control port being configured and arranged to capacitively couple to the first base region via a sidewall of the trench for controlling current flow in the thyristor body; and
a pass device having a gate and coupled in series between the first emitter region and a bit line, the pass device being configured and arranged to electrically couple the bit line to the first emitter region in response to a signal applied to the gate.

6. The thyristor-based memory cell of claim 5, wherein the dielectric material includes a deposited dielectric material that exhibits higher resistance to voltage-induced stress, relative to thermally-grown dielectric material.

7. The thyristor-based memory cell of claim 6, wherein the dielectric material includes a thermally-grown dielectric material.

8. The thyristor-based memory cell of claim 5, wherein the dielectric material includes a thermally-grown dielectric material that exhibits a faster growth rate on higher-doped substrates, relative to a growth rate on lesser doped substrates.

* * * * *

UNITED STATES PATENT AND TRADEMARK OFFICE
CERTIFICATE OF CORRECTION

PATENT NO. : 6,835,997 B1
APPLICATION NO. : 10/282294
DATED : December 28, 2004
INVENTOR(S) : Horch et al.

It is certified that error appears in the above-identified patent and that said Letters Patent is hereby corrected as shown below:

On the Cover Page, Item (56) Other Publications

"Jun. 1998, Nemati, Farid, and Plummer, James D., "A Novel High Density, Low Voltage SRAM Cell with a Vertical NDR Devide", VLSI Technology Technical Digest."
   should read --Jun. 1998, Nemati, Farid, and Plummer, James D., "A Novel High Density, Low Voltage SRAM Cell with a Vertical NDR Device", VLSI Technology Technical Digest. --

"K. De Meyer, S. Kubicek and H. can Meer, *Raised Source/Drains with Disposable Spacers for sub 100 nm CMOS technologies,* Extended Abstracts of International Workshop on Junction Technology 2001."
   should read --K. DeMeyer, S. Kubicek and H. Van Meer, *Raised Source/Drains with Disposable Spacers for sub 100 nm CMOS technologies*, Extended Abstract of International Workshop on Junction Technology 2001. --

"Oct. 10, 2001, N. Lindert, Y.-K. Choi, L. Chang, E. Anderson, W.-C. Lee, T.-J. King, J. Bokor, and C. Hu. *Quasi-Planar FinFETs with Selectivity Grown Germanium Raidse Source./Drain,* 2001 IEEE International SOI Conference, 10/01."
   should read -- Oct. 10, 2001, N. Lindert, Y.-K. Choi, L. Cang, E. Anderson, W.-C. Lee, T.-J. King, J. Bokor, and C. Hu. *Quasi-Planar FinFETs with Selectivity Grown Germanium Raised Source/Drain*, 2001 IEEE International SOI Conference, 10/01. --

"Hsiang-Jen Huang, Kun-Ming Chen, Tiao-Yuan Huang, Tien-Sheng Chao, Guo-Wei Huang, Chao-Hsin Chien, and Chun-Yen Chang, *Improved Low Temperature Characteristics of P-Channel MOSFETs with $Si_{1-x}$ Gex Raised Source and Drain*, IEEE Transactions on Electron Devices, vol. 48, No. 8, Aug. 2001."
   should read --Hsiang-Jen Huang, Kun-Ming Chen, Tiao-Yuan Huang, Tien-Sheng Chao, Guo-Wei Huang, Chao-Hsin Chien, and Chun-Yen Chang, *Improved Low Temperature Characteristics of P-Channel MOSFETs with $Si_{1-x}Gex$ Raised Source and Drain*, IEEE Transactions on Electron Devices, vol. 48, No. 8, Aug. 2001. --

"8 Claims, No Drawings" should read -- 8 Claims, 5 Drawings --.

UNITED STATES PATENT AND TRADEMARK OFFICE
CERTIFICATE OF CORRECTION

PATENT NO. : 6,835,997 B1
APPLICATION NO. : 10/282294
DATED : December 28, 2004
INVENTOR(S) : Horch et al.

It is certified that error appears in the above-identified patent and that said Letters Patent is hereby corrected as shown below:

In the Specification

Col. 7, line 39: "materials 123and 124" should read --materials 123 and 124 --.

Signed and Sealed this

Twenty-sixth Day of December, 2006

JON W. DUDAS
*Director of the United States Patent and Trademark Office*